United States Patent [19]

Barnert

[11] Patent Number: 4,864,256
[45] Date of Patent: Sep. 5, 1989

[54] OSCILLATOR WITH REDUCED HARMONICS

[75] Inventor: Armin Barnert, Roth, Fed. Rep. of Germany

[73] Assignee: Spectrum Control, Inc., Erie, Pa.

[21] Appl. No.: 243,335

[22] Filed: Sep. 9, 1988

[51] Int. Cl.$^4$ ............................ H03B 1/04; H03B 5/36
[52] U.S. Cl. ................................. 331/116 R; 331/74; 331/105; 331/158
[58] Field of Search ............... 331/57, 74, 105, 108 C, 331/108 D, 116 R, 116 FE, 158

[56] References Cited

U.S. PATENT DOCUMENTS

| | | | |
|---|---|---|---|
| 3,958,190 | 5/1976 | Minch | 331/116 R |
| 4,039,973 | 8/1977 | Yamashiro | 331/116 R |
| 4,211,985 | 7/1980 | Yamashiro | 331/116 FE |
| 4,376,918 | 3/1983 | Masuda et al. | 331/116 FE |
| 4,378,532 | 3/1983 | Burgoon | 331/158 |
| 4,383,224 | 5/1983 | Saari | 331/74 |
| 4,387,349 | 6/1983 | Rapp | 331/116 FE |
| 4,521,699 | 6/1985 | Wilson | 307/456 |
| 4,571,558 | 2/1986 | Gay et al. | 331/105 |
| 4,578,650 | 3/1986 | Watson | 331/160 |
| 4,587,497 | 5/1986 | Keller et al. | 331/116 R |

*Primary Examiner*—David Mis
*Attorney, Agent, or Firm*—Marshall, O'Toole, Gerstein, Murray & Bicknell

[57] ABSTRACT

An oscillator for producing an oscillating signal with reduced harmonics includes an oscillator stage coupled to an output stage having a relatively fast switching speed yet producing an oscillating signal having relatively slow rise and fall times so that the harmonics output by the oscillator are reduced. In one embodiment, the oscillator includes an output stage having low power Schottky circuitry, and in a second embodiment, the output stage includes a capacitor connected across the output stage of the oscillator to increase the rise and fall times of the oscillator.

13 Claims, 4 Drawing Sheets

OSCILLATOR WITH REDUCED HARMONICS

BACKGROUND OF THE INVENTION

The present invention relates to oscillators used in electronic circuit, and more particularly to an oscillator for producing an oscillating signal of a desired frequency while reducing the magnitude and number of unwanted harmonics of the signal frequency.

Oscillators are conventional circuits used to generate an oscillating signal of a particular desired frequency. Oscillators are commonly used in electronic circuits for a multitude of purposes. For example, oscillators may be used in computer circuits to generate relatively high frequency, e.g., 16 MHz, clocking signals for computers. Along with the desired oscillating signal, an oscillator typically produces harmonics of the signal. These harmonics are produced by the nonlinear operation of transistors in the oscillator. Sometimes these harmonics interfere with the operation of other circuits in the vicinity of the oscillator. The harmonics are referred to as electromagnetic interference.

In conventional high-frequency oscillators, such as the aforementioned 16 MHz clocking oscillator for computers, short (fast) rise and fall times in the oscillator output signal are desired to obtain the relatively high output frequency. However, such short rise and fall times generate unwanted harmonics. Changing the oscillator circuit to lengthen, i.e., increase, the oscillator signal rise and fall times in an attempt to reduce the unwanted harmonics results in an undesired lowered oscillator frequency when the output signal waveform conforms to the input specification of logic circuits such as TTL or CMOS.

A number of other approaches have been used to reduce the amount of unwanted harmonics produced by oscillators while maintaining the desired output oscillator frequency. In some cases, filters have been added to conventional oscillators to filter out the harmonics. This approach has the disadvantage that various filters are necessary, depending upon the harmonic frequencies to be removed. In other cases, the circuitry of the oscillator itself has been changed in an attempt to reduce harmonics. This approach suffers the disadvantage that different types of oscillators need to be modified in different ways.

Thus, a simple, inexpensive, and relatively universal manner of reducing the harmonic output of various types of oscillators, particularly high-frequency oscillators, while maintaining the desired output oscillator frequency, has heretofore been lacking.

SUMMARY OF THE INVENTION

The present invention overcomes the foregoing problems by providing a manner of reducing the harmonic output of an oscillator that is extremely simple, inexpensive, and effective for various types of oscillators. In accordance with the invention, an oscillator is provided with an output stage which produces an oscillating signal having a relatively long rise time and a relatively long fall time. Because the output stage produces a signal having these long rise and fall times, the number and magnitude of the harmonics output by the oscillator are significantly reduced.

Another advantage of the invention is that an output stage having the switching and impedance characteristics that are desirable in accordance with the invention can be connected to many types of conventional, preexisting oscillators without the need to redesign the circuitry of each particular oscillator.

In one embodiment of the invention, the output stage may comprise a conventional integrated circuit such as a low power Schottky inverter. In this embodiment, fast switching speed is provided by Schottky transistors in the Schottky inverter, and the relatively long rise and fall times of the oscillating output signal are provided by the higher internal resistance of the low power circuit.

In a second embodiment of the invention, the output stage may include a circuit with a capacitor coupled to the output of the circuit in order to lengthen, i.e., increase, the rise and fall times of the oscillating signal generated by the circuit and thereby reduce the amount of unwanted harmonics produced by the oscillator.

These and other objects, features, and advantages of the present invention will be apparent to those of ordinary skill in the art in view of the detailed description of the preferred embodiments, which is made with reference to the drawings, a brief description of which is provided below.

BRIEF DESCRIPTION OF THE DRAWINGS

FIG. 1b is an illustration of the magnitude of the harmonics of the frequency of the oscillating signal shown in FIG. 1a;

FIG. 3b is an illustration of the magnitude of the harmonics of the frequency of the oscillating signal shown in FIG. 3a;

FIG. 7b is an illustration of the magnitude of the harmonics of the frequency of the oscillating signal shown in FIG. 7a.

DETAILED DESCRIPTION OF THE PREFERRED EMBODIMENTS

Figure 1A:
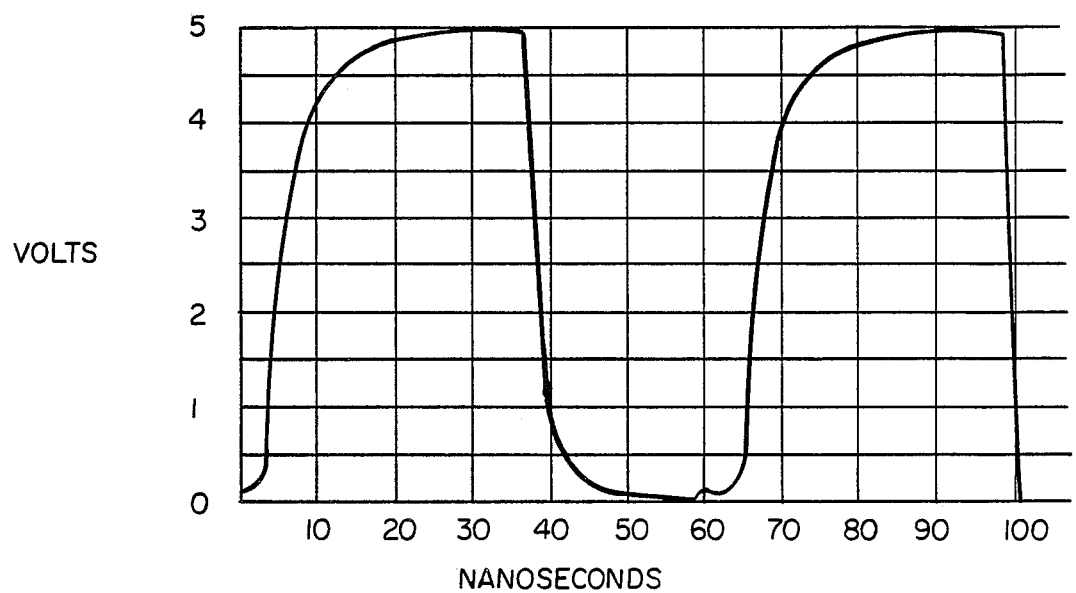
FIG. 1a is an illustration of the shape of an oscillating signal output from a conventional oscillator.

Conventional oscillators typically include an oscillator stage coupled to an output stage, which may be, for example, an output buffer. Since it is desirable to maximize the speed at which the oscillator can oscillate, circuit designers typically choose an output stage which produces an oscillating signal having relatively fast, i.e., short, rise and fall times. For example, the oscillating signal shown in FIG. 1a is representative. Now referring to FIG. 1a, a portion of an oscillating signal having a frequency of 16 MHz is shown. As illustrated, the signal has a relatively quick rise time and an even quicker fall time. As used herein, the term "rise time" is defined as the time required for a signal to increase from 10 percent of its maximum amplitude to 90 percent of its maximum amplitude, regardless of the particular value of that maximum amplitude. Similarly, the term "fall time" means the time required for the signal to decrease from 90 percent of its maximum amplitude to 10 percent of its maximum amplitude. As can be seen from FIG. 1a, the oscillating signal rises from 0.5 volts to 4.5 volts in approximately eight nanoseconds ($8 \times 10^{-9}$ sec.). The fall time, which is approximately four nanoseconds, is even shorter.

Figure 1B:
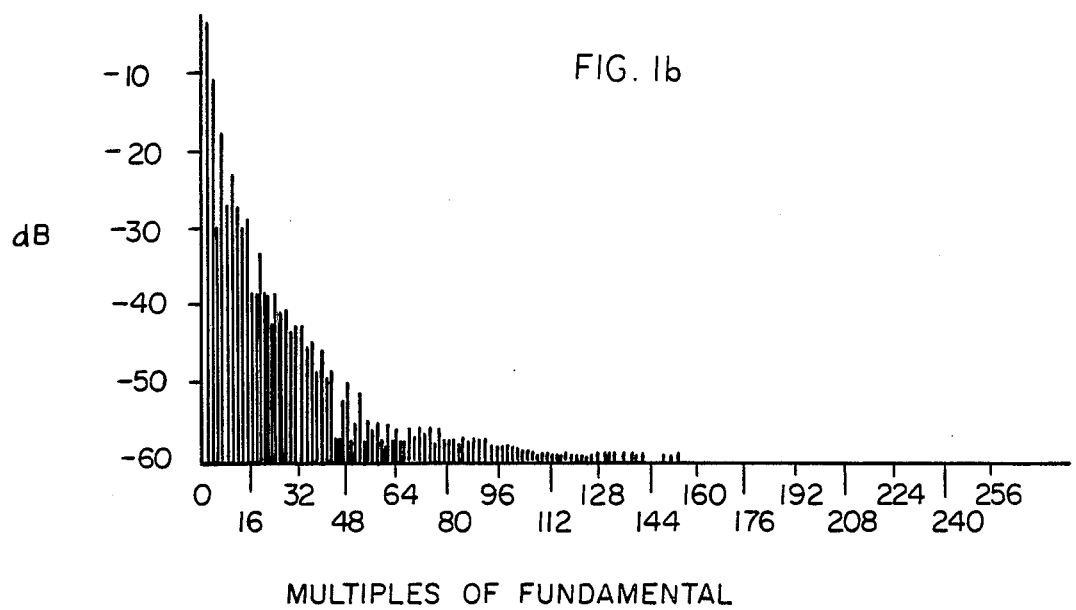

Now referring to FIG. 1b, a graph of the calculated harmonic output corresponding to the signal shown in FIG. 1a is illustrated. The horizontal axis corresponds to multiples of the fundamental frequency of the oscillating signal while the vertical axis corresponds to the magnitude of the signal in decibels (dB) as compared with the maximum signal strength. As can be seen from FIG. 1b, the average magnitude of the peak harmonics present from 16 to 32 times the frequency of the oscillating signal is approximately −40 dB, and a significant amount of harmonics are present at frequencies greater than 35 times the fundamental frequency. These harmonics, which would be radiated by the oscillator, would interfere with the operation of other circuits in the vicinity of the oscillator.

In attempting to overcome this problem of unwanted harmonics, the inventors recognized that the amount of harmonics produced by an oscillator depends upon the shape of the signal waveform output by the oscillator. Furthermore, the inventors recognized that the shape of the signal output from an oscillator is generally similar in shape to a trapezoidal waveform. The inventors realized that if the shape of the waveform generated by the oscillator were altered, a lower harmonic output might be achieved, since the magnitude of the harmonics produced is a function of the shape of the signal waveform in accordance with Fourier analysis.

Figure 2:
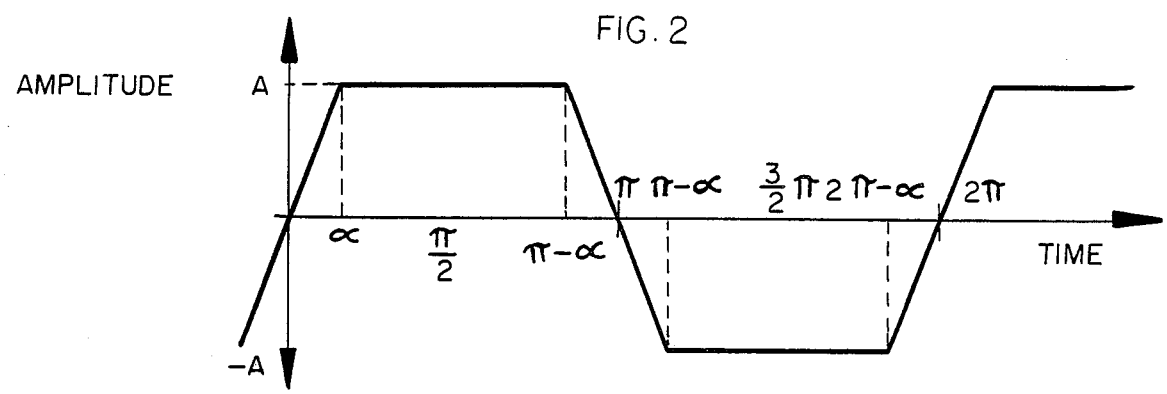
FIG. 2 shows a trapezoidal waveform.

Now referring to FIG. 2, a trapezoidal waveform is shown that roughly corresponds in shape to the oscillating signal output by an oscillator. The trapezoidal waveform has a maximum positive amplitude of A and a maximum negative amplitude of −A. The waveform changes from zero to its maximum amplitude in a time defined as α. According to conventional Fourier analysis, the shape of the trapezoidal waveform shown in FIG. 2 can be represented by the summation of an infinite series of terms where each of the terms represents the magnitude a particular harmonic frequency. The Fourier series corresponding to the trapezoidal waveform is set forth below as Equation 1.

$$Y = \frac{4 * A}{\pi * \alpha} (\sin \alpha \sin x + 1/3^2 \sin 3\alpha \sin 3x + 1/5^2 \sin 5\alpha \sin 5x + \ldots) \quad [1]$$

In Equation 1, A is the amplitude of the trapezoidal waveform and o is the time required for the magnitude of the trapezoidal waveform to change between zero and its maximum amplitude in either the negative or positive direction. Since the trapezoidal waveform changes from its maximum positive amplitude to its maximum negative amplitude in linear fashion, the rise time (and fall time) as defined above is equal to 80% of α. It can be seen from Equation 1 that the magnitude of the harmonic frequencies is directly proportional to the amplitude A of the signal waveform and inversely proportional to α, which as just explained, is directly proportional to the rise time and fall time of the waveform Thus, it can be seen from Equation 1 above that in order to reduce the magnitude of harmonics, the rise time and fall time of the signal waveform should be maximized.

Figure 3A:
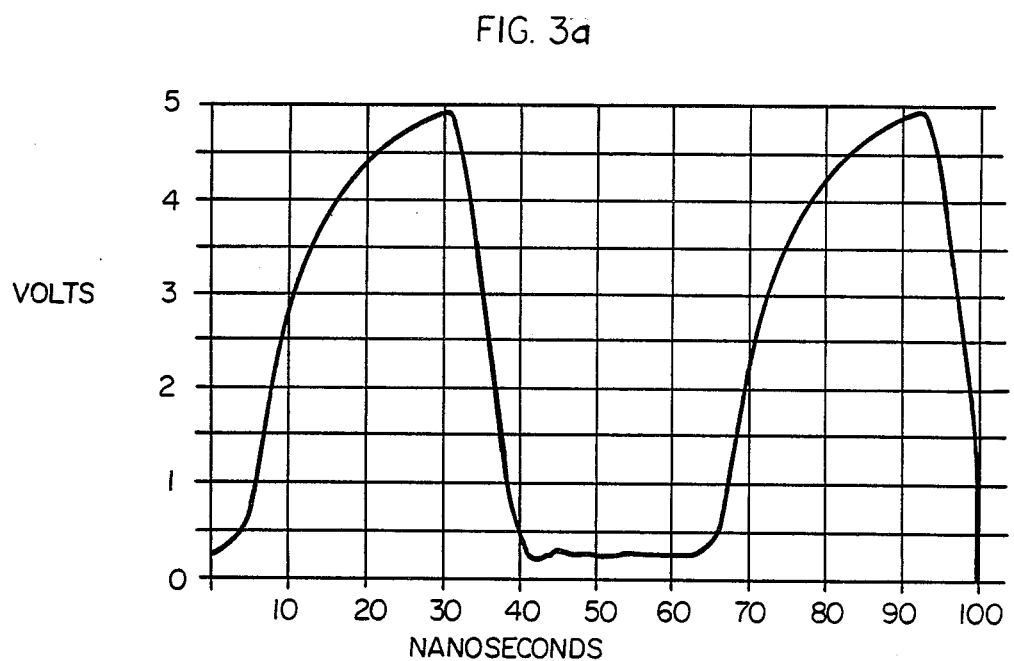
FIG. 3a is an illustration of the shape of an oscillating signal output from an oscillator in accordance with the invention.
Figure 3B:
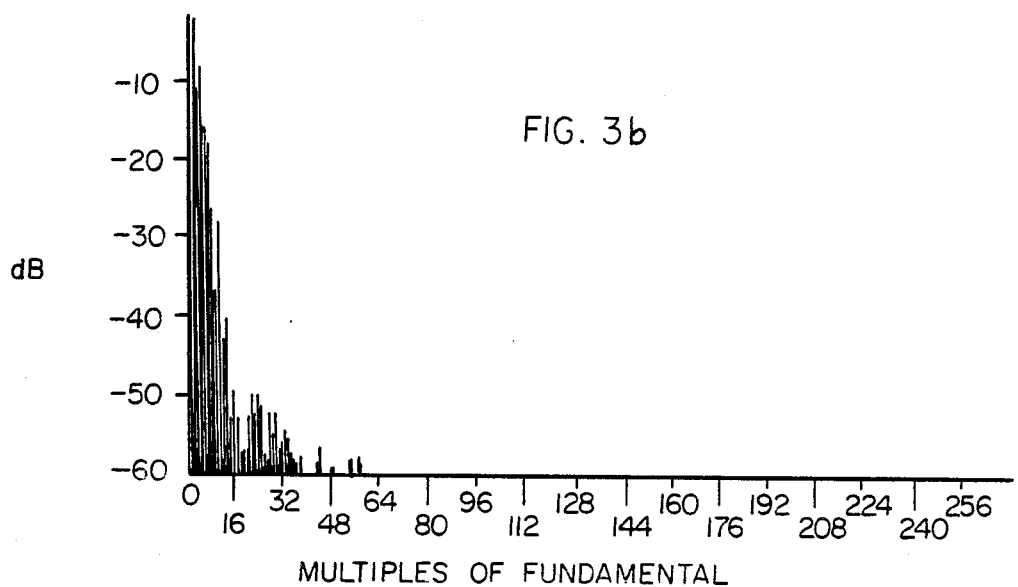

Now referring to FIG. 3a, a waveform with a frequency of 16 MHz having increased rise and fall times is shown. As can be seen from FIG. 3a, the rise time of the waveform is approximately 18 nanoseconds, and the fall time is approximately eight nanoseconds. A graph of the magnitude of the harmonics that would be produced by the waveform shown in FIG. 3a is shown in FIG. 3b. This graph illustrates that the magnitude and number of the harmonics is significantly decreased. In particular, the average magnitude of harmonics present between 16 and 32 times the fundamental frequency is approximately 55 dB below the magnitude of the fundamental frequency, and there is no significant amount of harmonics present above approximately 35 times the fundamental frequency.

In typical prior art oscillators, the rise and fall times depend upon both the frequency at which an oscillator is run and the load at the output of the oscillator. In a typical prior art oscillator, in the frequency range of approximately 0 to 25 megahertz (MHz), the rise and fall times are within the approximate range of two and 15 nanoseconds, depending upon the load at the output of the oscillator. When a prior art oscillator is operated at a frequency between approximately 25 MHz and 70 MHz, the rise and fall times are within the approximate range of one and six nanoseconds.

Figure 4:
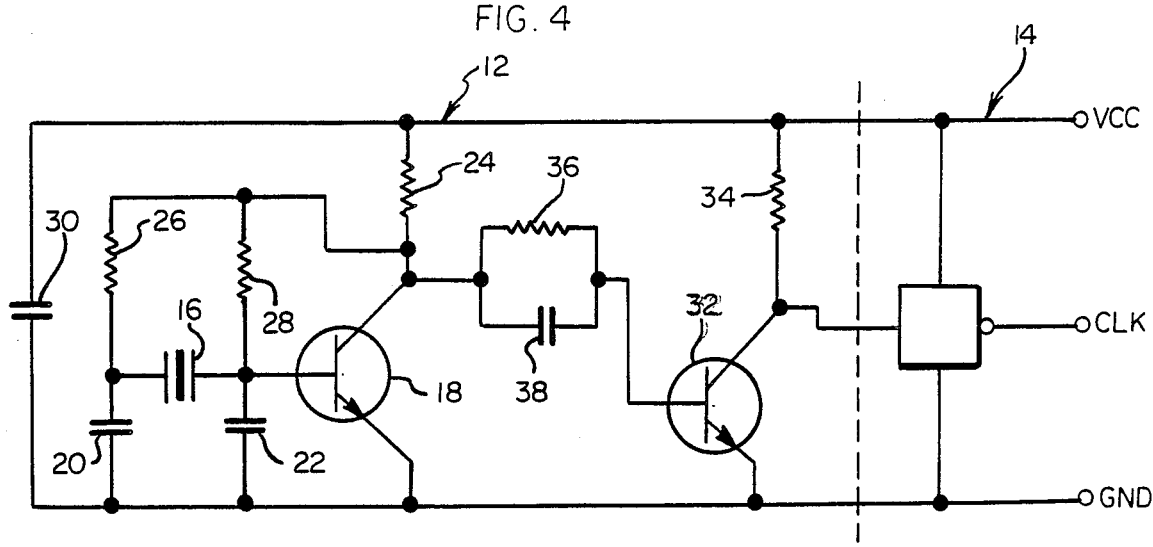
FIG. 4 is a circuit diagram of a first embodiment of an oscillator in accordance with the invention.

One preferred embodiment of the invention taking advantage of this phenomenon, which is shown in FIG. 4, is a Pierce oscillator comprising an oscillator stage coupled to an output stage having particular electrical response characteristics. The oscillator is for use in TTL circuits and has an approximate frequency range of 7.5 MHz to 70 MHz, depending upon the values of the circuit components used.

Now referring to FIG. 4, this embodiment includes an oscillator stage 12 coupled to an output stage 14, which acts as an output buffer. The oscillator stage 12 generates a periodic signal which is supplied to the output stage 14 where it is reshaped so that harmonics are reduced. The oscillator stage 12 includes a crystal 16 connected to the base of an NPN transistor 18. A capacitor 20 is connected between the crystal 16 and ground, and a second capacitor 22 is connected between the junction of crystal 16 and the base of the transistor 18 and ground. The capacitance values of the capacitors 20, 22 in combination with crystal 16 determine the frequency of oscillation of the oscillator stage 12. Generally, smaller capacitors are used for higher frequencies.

A biasing resistor 24 is connected between the supply voltage (Vcc) and the collector of the transistor 18, and a resistor 26 is connected between the collector of the transistor 18 and the side of the crystal 16 to which the capacitor 20 is attached. Another resistor 28 is provided between the collector and base of the transistor 18. The two resistors 26, 28 provide feedback from the collector of the transistor 18 to sustain the oscillation of the oscillator stage 12. A capacitor 30 is connected between the supply voltage and ground in order to suppress interference of the oscillator output from the supply voltage.

The oscillator stage 12 includes a second NPN transistor 32 having its collector connected to a resistor 34 connected to the supply voltage. The base of the transistor 32 is coupled to the collector of the transistor 18 via a resistor 36 and a capacitor 38 connected in parallel. This part of the circuit works as a level shifter to provide the right signal for the output stage 14. The voltage at the collector of the transistor 32, which varies in a periodic manner with a frequency corresponding to the desired frequency of oscillation, is supplied to the output stage 14 to generate the oscillating signal. The component values for this embodiment are set forth in Table 1 below.

Figure 5:
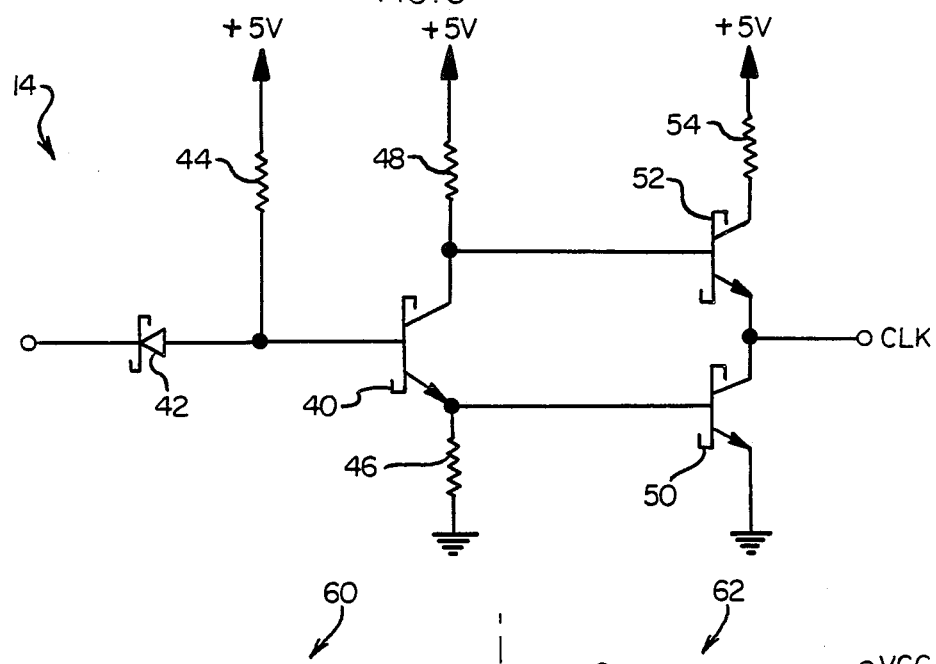
FIG. 5 is a circuit diagram of a first embodiment of the output stage of the oscillator embodiment shown in FIG. 4.

A detailed circuit diagram of the output stage 14 shown in FIG. 4 is illustrated in FIG. 5. The output stage 14 is a conventional low power Schottky inverter circuit. Now referring to FIG. 5, the output of the oscillator stage 12 is supplied to the base of a Schottky NPN transistor 40 via a Schottky diode 42. A resistor 44 is connected to the junction of the base of the transistor 40 and the diode 42. The transistor 40 has a resistor 46 connected to its emitter and a resistor 48 connected to its collector. The resistance values of the resistors 44, 46, 48 in the low power Schottky inverter circuit shown in FIG. 5 have larger values than their counterparts in a regular Schottky inverter circuit. In particular, the resistors 44, 46, 48 shown in FIG. 5 have resistance values of 20 kohms, 3 kohms, and 8 kohms, respectively, while the corresponding resistors in a regular Schottky inverter circuit have resistance values of 6 kohms, 1 kohm, and 1.6 kohms, respectively. As explained below, the higher resistance of the low power Schottky circuit shown in FIG. 5 enables obtaining of the lengthened, i.e., increased, rise and fall times of the output signal.

The emitter of the transistor 40 is also connected to the base of a Schottky NPN transistor 50, and the collector of the transistor 40 is connected to the base of another Schottky NPN transistor 52. The collector of the transistor 52 is connected to a resistor 54. The output stage 14 produces the oscillating signal at the junction of the collector of the transistor 50 and the emitter of the transistor 52, which is coupled to the CLK output line.

Schottky circuits, or circuits which contain Schottky transistors, have fast switching speeds since Schottky transistors have metal-semiconductor junctions which have very low parasitic capacitances. Although Schottky circuits have fast switching speeds, the resultant output has very short, i.e., fast, rise and fall times, which the inventors recognized as generating an undue amount of harmonics. However, a low power Schottky circuit, like the one described in connection with FIG. 5, has an increased internal resistance so that the current, and hence the power, used in the circuit is reduced. One side effect of the higher resistance low power Schottky circuit, which is desirable in accordance with the invention, is that the rise and fall times of the output signal are lengthened, i.e., increased, due to the smaller current produced in the circuit. Because the current is smaller, more time is required to recharge the parasitic capacitance in the circuit. Thus, low power Schottky circuits have fast switching speeds and generate relatively slow rise and fall time signals, which is advantageous in accordance with the invention since it enables high rates of oscillation with reduced amounts of harmonics.

Figure 6:
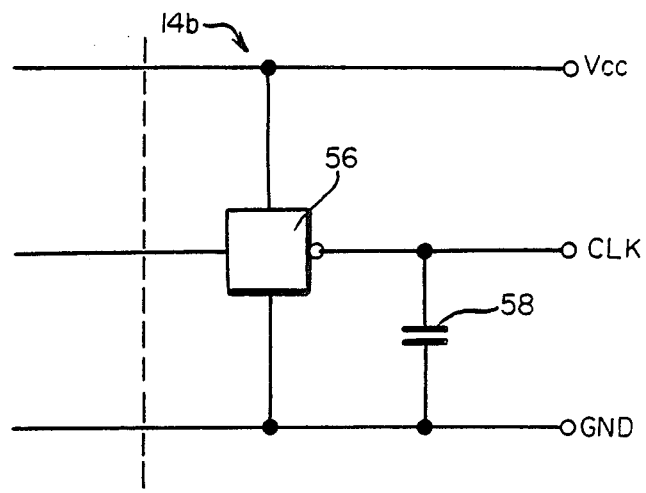
FIG. 6 is a circuit diagram of an alternative embodiment of the output stage of the oscillator embodiment shown in FIG. 4.

The embodiment just described can be modified so that it can be used in CMOS circuits simply by using a different output stage 14, which is shown in FIG. 6 as output stage 14b. This output stage 14b consists of an output circuit 56 and a capacitor 58 connected between the output of the output circuit 56 and ground. The output circuit 56 may be a commercially available 74HC04, 74HCU04, or 74HCT04 or a custom designed integrated circuit chip. The capacitor 58 is used to increase the rise and fall times of the output stage 14b as is described in more detail below in connection with FIG. 8.

Figure 7A:
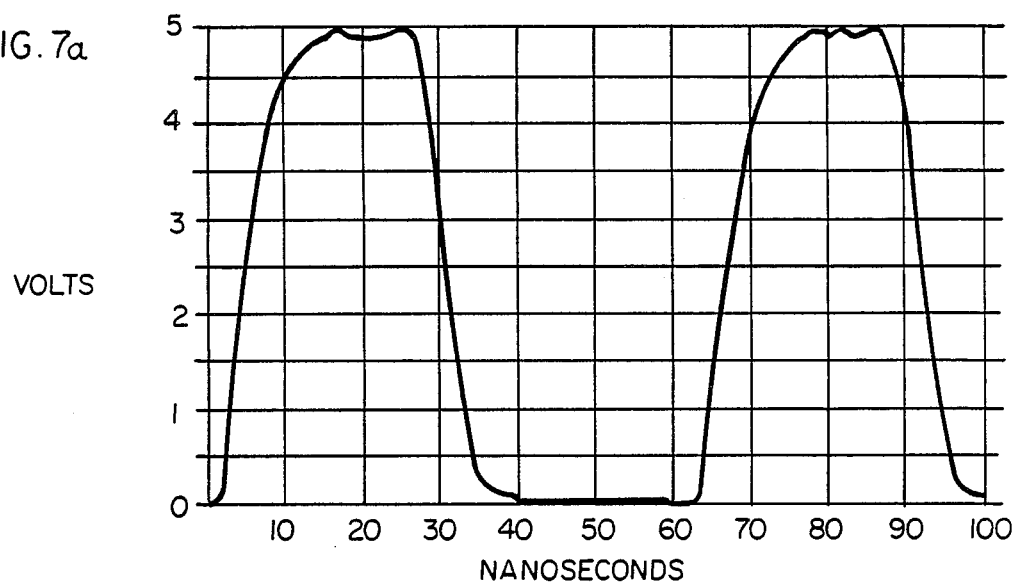
FIG. 7a is an illustration of the shape of an oscillating signal output from the embodiment of the invention shown in FIG. 6.
Figure 7B:
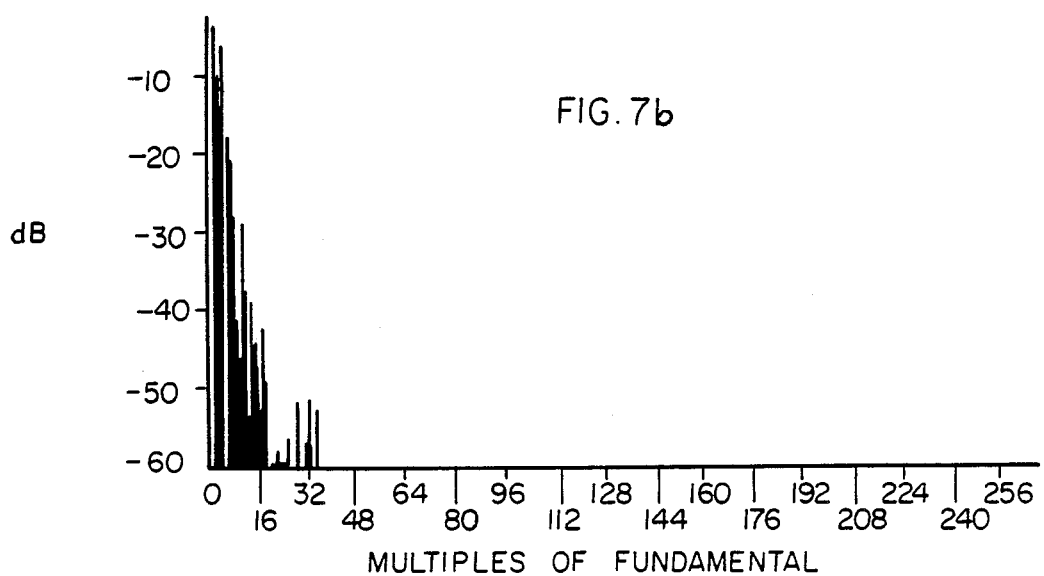

An illustration of the output of the modified embodiment just described in connection with FIG. 6 is shown in FIG. 7a, and the corresponding magnitudes of the harmonics produced are shown in FIG. 7b. It should be noted that the rise and fall times of the signal shown in FIG. 7a are approximately eight nanoseconds, and as a result, the magnitude of the harmonics shown in FIG. 7b are significantly reduced.

Figure 8:
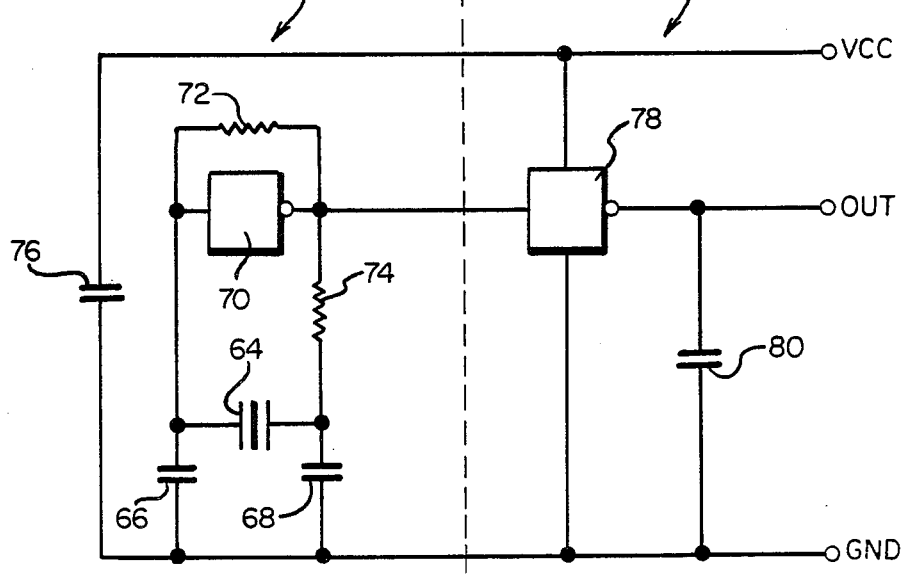
FIG. 8 is a circuit diagram of a second embodiment of an oscillator in accordance with the invention.

A second preferred embodiment of the invention is shown in FIG. 8. This second embodiment is intended for use in CMOS circuits. The approximate frequency range of this embodiment is from 3.5 MHz to 70 MHz. The particular frequency generated depends upon the values of the circuit components, which are listed in Table 2 below.

Now referring to FIG. 8, the second embodiment comprises an oscillator stage 60 coupled to an output stage 62. The oscillator stage 60 includes a crystal 64 connected to ground via a first capacitor 66 and a second capacitor 68. The crystal 66 is also connected to an inverter 70, which may be a 74HCT04, 74HC04, 74HCU04, 74AC04, or a custom designed integrated circuit. The inverter 70, which provides a periodic signal having the desired frequency to the output stage 62, is connected in parallel to a feedback resistor 72 and is also connected to a third resistor 74. When the oscillator stage 60 is designed for lower frequencies, for example, 3.5 MHz to 12 MHz, the resistor 74 should have a resistance of approximately 2000 ohms, as indicated in Table 2 below. However, when the oscillator stage 60 is to operate at higher frequencies, for example, 12 MHz to 70 MHz, the resistor 74 is not used and a short circuit or wire connection is used in its place. A capacitor 76 is connected between the supply voltage and ground.

The output stage 62 includes an inverter 78 which receives the periodic signal output from the oscillator stage 60 and generates the oscillatory signal therefrom. In this preferred embodiment, the inverter 78 is the same circuit as the inverter 70 in the oscillator stage 60. A capacitor 80 is connected across the output of the inverter 78.

The purpose of the capacitor 80 is to slow down, i.e., lengthen, the rise time and fall time of the oscillating signal. In particular, the inverter 78 used in this embodiment, which may be a high speed CMOS circuit such as a 74HCT04, has a fast switching speed, but also normally generates signals with fast rise and fall times. In order to achieve the benefits of the invention, however, the output signal must have slower rise and fall times. The capacitor 80 is used across the output of the inverter 78, so that when the inverter output changes from low to high, the output of the output stage 62 does not rise quickly, but is instead slowed due to the time it takes the capacitor 80 to charge. Similarly, the fall time of the oscillatory output of the output stage 62 is increased due to the time it takes the capacitor 80 to discharge.

In Tables 1 and 2 below, which list the component values for the embodiments described in connection with FIGS. 4 and 8, the component values for the resistors and capacitors are in ohms and picofarads, respectively.

TABLE 1

| MHz | $C_{22}$ | $C_{20}$ | $C_{38}$ | $C_{30}$ | $R_{24}$ | $R_{28}$ | $R_{26}$ | $R_{36}$ | $R_{34}$ | T |
|---|---|---|---|---|---|---|---|---|---|---|
| 7.5–10 | 270 | 150 | 82 | 10000 | 330 | 1065 | 250 | 1000 | 91 | BSV52 |
| 10–14 | 180 | 100 | 68 | 10000 | 330 | 1065 | 250 | 1000 | 91 | BSV52 |
| 14–15 | 270 | 47 | 68 | 10000 | 330 | 1065 | 250 | 1000 | 91 | BSV52 |
| 15–19 | 180 | 56 | 47 | 10000 | 330 | 1065 | 250 | 1000 | 91 | BSV52 |
| 19–25 | 150 | 33 | 22 | 10000 | 330 | 1065 | 250 | 1000 | 91 | BSV52 |
| 25–70 | 120 | 22 | 15 | 10000 | 330 | 1065 | 250 | 1000 | 91 | BSV52 |

TABLE 2

| MHz | $C_{68}$ | $C_{66}$ | $C_{76}$ | $C_{80}$ | $R_{72}$ | $R_{74}$ |
|---|---|---|---|---|---|---|
| 3.5–12 | 47 | 33 | 10000 | 25 | 20000 | 2000 |
| 12–15 | 10 | 33 | 10000 | 20 | 20000 | 0 |
| 15–25 | 10 | 22 | 10000 | 15 | 20000 | 0 |
| 25–70 | 10 | 15 | 10000 | 15 | 20000 | 0 |

The oscillator embodiment described above are advantageous because the rise and fall times are increased, so that the amount of unwanted harmonics is reduced. The rise and fall times of the oscillator embodiments in accordance with the invention vary depending upon the frequency at which the oscillator is operated and the load at the oscillator output. In particular, when the oscillator is operated between zero and 25 MHz, the rise and fall times of the oscillating signal have an approximate range of eight to 15 nanoseconds, depending upon the output load. For any given output load, the rise and fall times will remain constant; however, if the output load is changed, the rise and fall times will change, but they will still be within the stated range. When the oscillator is operated between approximately 25 MHz and 70 MHz, the rise and fall times have an approximate range of five to eight nanoseconds, again depending upon the output load. Thus, the rise and fall time ranges in accordance with the present invention are significantly narrowed with respect to those of the prior art so that reduced harmonic output is ensured.

The benefits of the invention may be achieved with any type of conventional oscillator such as Pierce, Hartley, Colpitts, etc. Different types of output stages could be used such as noninverting output stages. The only requirement for the output stage is that it produce an output signal having relatively long rise time and fall times in order to produce the oscillating signal having reduced harmonics. The benefits of the invention would be obtained regardless of whether the oscillator was embodied in a single monolithic integrated circuit or a number of separate integrated circuits.

Further modifications and alternative embodiments of the invention will be apparent to those skilled in the art in view of the foregoing description. Accordingly, this description is to be construed as illustrative only, and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. An oscillator for producing an oscillating signal having a desired frequency which reduces the magnitude of the harmonics of the desired frequency so that undesired electromagnetic interference between the oscillator and other electrical components in the vicinity of the oscillator is reduced, said oscillator comprising:

an oscillator stage that produces a periodic signal having the desired frequency; and an output stage coupled to said oscillator stage to receive the periodic signal, said output stage producing an oscillating signal from the periodic signal, said output stage having a switching speed and an impedance sufficient to cause the oscillating signal to have a rise time with an approximate range of eight to 15 nanoseconds when the frequency of the oscillating signal is between approximately one megahertz and approximately 25 megahertz, and a rise time with an approximate range of five to eight nanoseconds when the frequency of the oscillating signal is between approximately 25 megahertz and approximately 70 megahertz.

2. An oscillator as defined in claim 1 wherein said output stage comprises an inverter.

3. An oscillator as defined in claim 2 additionally comprising a capacitor connected between the output of said inverter and ground.

4. An oscillator as defined in claim 2 wherein said inverter comprises three Schottky transistors, a diode, and four resistors.

5. An oscillator as defined in claim 4 wherein said inverter is contained in a 74LS04 integrated circuit 6. An oscillator as defined in claim 1 wherein said oscillator stage comprises:
a first transistor;
a crystal connected to the base of said first transistor; and
a pair of capacitors coupled between said crystal and ground.

7. An oscillator as defined in claim 6 wherein said first transistor is contained in a 74LS04 integrated circuit.

8. An oscillator as defined in claim 6 wherein said oscillator stage additionally comprises:
a second transistor coupled to said first transistor; and
a resistor and a capacitor connected in parallel between the collector of said first transistor and the base of said second transistor.

9. An oscillator comprising:
an oscillator stage; and
an output stage coupled to said oscillator stage, said output stage producing an oscillating signal having a rise time with an approximate range of eight to 15 nanoseconds when the frequency of the oscillating signal is between approximately one megahertz and 25 megahertz, and a rise time with an approximate range of five to eight nanoseconds when the frequency of the oscillating signal is between approximately 25 megahertz and approximately 70 megahertz.

10. An oscillator for producing an oscillating signal having a desired frequency which reduces the magnitude of the harmonics of the desired frequency so that undesired electromagnetic interference between the oscillator and other electrical components in the vicinity of the oscillator is reduced, said oscillator comprising:
   an oscillator stage; and
   an output stage coupled to said oscillator stage, said output stage producing an oscillating signal, said output stage comprising low power Schottky circuitry so that said output stage has a relatively fast switching time and produces a signal having relatively long rise and fall times.

11. An oscillator for producing an oscillating signal having a desired frequency which reduces the magnitude of the harmonics of the desired frequency so that undesired electromagnetic interference between the oscillator and other electrical components in the vicinity of the oscillator is reduced, said oscillator comprising:
   an oscillator stage; and
   an output stage coupled to said oscillator stage, said output stage having an output which produces an oscillating signal, said output stage including a capacitor connected across said output so that the rise and fall times of said oscillating signal are increased.

12. An oscillator for producing an oscillating signal having a desired frequency which reduces the magnitude of the harmonics of the desired frequency so that undesired electromagnetic interference between the oscillator and other electrical components in the vicinity of the oscillator is reduced, said oscillator comprising:
   an oscillator stage comprising:
      a first transistor;
      a crystal connected to the base of said first transistor;
      a pair of capacitors coupled between said crystal and ground;
      a second transistor coupled to said first transistor; and
      a resistor and a capacitor connected in parallel between the collector of said first transistor and the base of said second transistor; and
   an output stage coupled to said oscillator stage, said output stage producing an oscillating signal, the rise time of the oscillating signal to be at least five nanoseconds so that harmonics of said oscillating signal are reduced, said output stage comprising:
      a first Schottky transistor;
      a second Schottky transistor, the collector of said second Schottky transistor being connected to the emitter of said first Schottky transistor;
      a first resistor connected to the collector of said first Schottky transistor;
      a third Schottky transistor, the collector of said third Schottky transistor being connected to the base of said first Schottky transistor and the emitter of said third Schottky transistor being connected to the base of said second Schottky transistor;
      a second resistor connected to the collector of said third Schottky transistor;
      a third resistor connected to the emitter of said third Schottky transistor;
      a fourth resistor connected to the base of said third Schottky transistor; and
      a diode connected to the base of said third Schottky transistor.

13. An oscillator for producing an oscillating signal having a desired frequency which reduces magnitude of the harmonics of the desired frequency so that undesired electromagnetic interference between the oscillator and other electrical components in the vicinity of the oscillator is reduced, said oscillator comprising:
   an oscillator stage comprising:
      a crystal;
      a pair of capacitors connected between said crystal and ground;
      a first inverter connected to said crystal;
      a first resistor connected in parallel with said first inverter; and
      a second resistor connected between said first inverter and said crystal; and
   an output stage coupled to said oscillator stage, said output stage producing an oscillating signal and having a relatively fast switching time and a relatively high resistance, the relatively high resistance causing the rise time of the oscillating signal to be at least twice the switching time of said output stage so that undesired harmonics of said oscillating signal are reduced, said output stage comprising:
      a second inverter connected to said first inverter; and
      a third capacitor connected between said second inverter and ground;
      each of said first and said second inverters comprising:
      a first Schottky transistor;
      a second Schottky transistor, the collector of said second Schottky transistor being connected to the emitter of said first Schottky transistor;
      a third resistor connected to the collector of said first Schottky transistor;
      a third Schottky transistor, the collector of said third Schottky transistor being connected to the base of said first Schottky transistor and the emitter of said third Schottky transistor being connected to the base of said second Schottky transistor;
      a fourth resistor connected to the collector of said third Schottky transistor;
      a fifth resistor connected to the emitter of said third Schottky transistor;
      a sixth resistor connected to the base of said third Schottky transistor; and
      a diode connected to the base of said third Schottky transistor.

* * * * *